US010343928B2

(12) United States Patent
Watanabe et al.

(10) Patent No.: US 10,343,928 B2
(45) Date of Patent: Jul. 9, 2019

(54) METHOD FOR MANUFACTURING PLATE-LIKE ALUMINA POWDER AND PLATE-LIKE ALUMINA POWDER

(71) Applicant: NGK INSULATORS, LTD., Nagoya (JP)

(72) Inventors: Morimichi Watanabe, Nagoya (JP); Hiroshi Fukui, Obu (JP); Kei Sato, Tokai (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/446,479

(22) Filed: Mar. 1, 2017

(65) Prior Publication Data

US 2017/0166454 A1    Jun. 15, 2017

Related U.S. Application Data

(63) Continuation of application No. PCT/JP2015/082645, filed on Nov. 20, 2015.

(30) Foreign Application Priority Data

Nov. 28, 2014    (JP) ................................. 2014-241684

(51) Int. Cl.
  *C01F 7/30*    (2006.01)
  *C04B 35/626*    (2006.01)
  (Continued)

(52) U.S. Cl.
  CPC ................ *C01F 7/30* (2013.01); *C01F 7/441* (2013.01); *C01F 7/442* (2013.01); *C04B 35/111* (2013.01);
  (Continued)

(58) Field of Classification Search
  CPC ... C01F 7/30; C01B 1/02; C01B 29/20; C01B 29/64
  See application file for complete search history.

(56) References Cited

U.S. PATENT DOCUMENTS 5,538,709 A    7/1996    Mohri et al.
6,015,456 A    1/2000    Fukuda et al.
(Continued)

FOREIGN PATENT DOCUMENTS

CN    1100066 A    3/1995
CN    102674417 A    9/2012
(Continued)

OTHER PUBLICATIONS

Charles A. Shaklee, et al., "Growth of α-$Al_2O_3$ Platelets in the HF-γ-$Al_2O_3$ System," *Journal of American Ceramic Society*, vol. 77, No. 11, 1994, 2977-2984.
(Continued)

*Primary Examiner* — James A Fiorito
(74) *Attorney, Agent, or Firm* — Burr & Brown, PLLC

(57) ABSTRACT

96 parts by mass of a γ-alumina powder, 4 parts by mass of a an $AlF_3$ powder, and 0.17 parts by mass of an α-alumina powder as a seed crystal were mixed by a pot mill. The purities of each raw material were evaluated, and it was found that the mass ratio of each impurity element other than Al, O, F, H, C, and S was 10 ppm or less. In a high-purity alumina-made sagger having a purity of 99.9 percent by mass, 300 g of the obtained mixed powder was received, and after a high-purity alumina-made lid having a purity of 99.9 percent by mass was placed on the sagger, a heat treatment was perforated at 900° C. for 3 hours in an electric furnace in an air flow atmosphere, so that an alumina powder was obtained. The value of $AlF_3$ mass/container volume was 0.016 g/cm$^3$.

6 Claims, 2 Drawing Sheets

(51) Int. Cl.
*C30B 1/02* (2006.01)
*C30B 29/20* (2006.01)
*C30B 29/64* (2006.01)
*C01F 7/44* (2006.01)
*C04B 35/111* (2006.01)

(52) U.S. Cl.
CPC ...... *C04B 35/626* (2013.01); *C04B 35/62645* (2013.01); *C30B 1/02* (2013.01); *C30B 29/20* (2013.01); *C30B 29/64* (2013.01); *C01P 2004/03* (2013.01); *C01P 2004/20* (2013.01); *C01P 2004/22* (2013.01); *C01P 2004/50* (2013.01); *C01P 2004/54* (2013.01); *C01P 2004/61* (2013.01); *C01P 2004/62* (2013.01); *C01P 2006/80* (2013.01); *C04B 2235/5292* (2013.01); *C04B 2235/5296* (2013.01); *C04B 2235/72* (2013.01)

(56) References Cited

U.S. PATENT DOCUMENTS

| | | |
|---|---|---|
| 2002/0155944 A1 | 10/2002 | Kurashina et al. |
| 2006/0153769 A1 | 7/2006 | Robinson et al. |
| 2011/0052485 A1 | 3/2011 | Seo et al. |
| 2015/0315442 A1* | 11/2015 | Hofius ................ C09K 3/1427 51/308 |

FOREIGN PATENT DOCUMENTS

| | | |
|---|---|---|
| JP | 07-187663 A1 | 7/1995 |
| JP | 10-167725 A1 | 6/1998 |
| JP | 2916664 B2 | 7/1999 |
| JP | 2002-293609 A1 | 10/2002 |
| JP | 3759208 B2 | 3/2006 |
| JP | 4749326 B2 | 8/2011 |
| JP | 5255059 B2 | 8/2013 |

OTHER PUBLICATIONS

Mitsuo Shimbo, et al., "Influence of Addition of $AlF_3$ on Thermal Decomposition of Gibbsite and Phase Transition of the Intermediate Alumina to $\alpha$-$Al_2O_3$," *Journal of the Ceramic Society of Japan*, vol. 115, No. 9, 2007, pp. 536-540.

Keiji Daimon, et al., "Synthesis of Hexagonal Plate-Like Corundum Using Hydrated Aluminum Sulfate as Starting Materials," *Journal of the Ceramic Society of Japan*, vol. 94, No. 3, 1986, pp. 380-382.

International Search Report and Written Opinion (Application No. PCT/JP2015/082645) dated Jan. 19, 2016.

English translation of International Preliminary Report on Patentability (Application No. PCT/JP2015/082645) dated Jun. 8, 2017.

Chinese Office Action (Application No. 201580047885.3) dated Sep. 17, 2018.

* cited by examiner

METHOD FOR MANUFACTURING PLATE-LIKE ALUMINA POWDER AND PLATE-LIKE ALUMINA POWDER

BACKGROUND OF THE INVENTION

1. Field of the Invention

The present invention relates to a method for manufacturing a plate-like alumina powder and a plate-like alumina powder.

2. Description of the Related Art

Patent Literature 1 has disclosed an oriented alumina sintered body formed by using a plate-like alumina powder as a part of a raw material and also has shown that the corrosion resistance and the heat resistance are improved since the alumina sintered body is oriented. However, in order to obtain a high corrosion resistance and a high heat resistance, reduction in amount of impurities in the sintered body is required, and hence in order to further improve the characteristics, a high-purity plate-like alumina powder is desired.

In addition, it has been known that a high-purity and dense alumina sintered body has optical translucency, and Patent Literature 2 has disclosed the optical translucency of a ceramic polycrystalline body having a crystal structure, such as a triclinic crystal, a monoclinic crystal, an orthorhombic crystal, a tetragonal crystal, a trigonal crystal, or a hexagonal crystal. The above literature has shown that in an oriented alumina sintered body formed using a plate-like alumina powder as a part of a raw material, a sufficient heat resistance and a high in-line transmittance can be realized. However, it has been known that in order to realize a high optical translucency by an alumina sintered body, in general, the alumina sintered body is required to have a high impurity, and hence, a high-purity plate-like alumina powder is necessary. As a method for manufacturing a plate-like alumina powder, for example, methods disclosed in Patent Literatures 3 to 5 and Non-Patent Literatures 1 have been known.

CITATION LIST

Patent Literature

PTL 1: JP 2916664 B
PTL 2: JP 2002-293609 A
PTL 3: JP 3759208 B
PTL 4: JP 4749326 B
PTL 5: JP 5255059 B

Non-Patent Literature

NPL 1: J. Am. Ceram. Soc., 77[11]2977-84 (1994)

SUMMARY OF THE INVENTION

However, according to Patent Literature 3, since impurities remain, for example, by influences of additives used in manufacturing of a plate-like alumna powder, a high-purity plate-like alumina powder has not been obtained. In addition, although Patent Literatures 4 and 5 have disclosed a method in which after a plate-like aluminum powder is synthesized, additives and the like are removed toy a washing step or the like, the method, is not good enough to achieve a high purity of 99.9 percent by mass or more. On the other hand, although Non-Patent Literature 1 has disclosed a method for forming a plate-like alumina powder using a γ-alumina powder or a boehmite powder together with a HF solution, a HF solution which is not easily handled is inevitably used. In addition, since the method disclosed in Non-Patent Literature 1 includes a step of treating the surface of a γ-alumina ponder with a HF solution, when the amount of the powder to be treated is large, the treatment condition of the γ-alumina powder varies, and the particle diameter and the shape of the plate-like alumina powder may be adversely influenced in some cases. Hence, when a large amount of a plate-like alumina powder is formed, a HF treatment must be performed a plurality of times, and as a result, the workability and the manufacturing cost still regain as problems.

The present invention was made in order to resolve the problems as described above and primarily aims to easily obtain a large amount of a high-purity plate-like alumina powder without using a HF solution which is not easily handled.

A method for manufacturing a plate-like alumina powder according to the present invention comprises a step (a) of obtaining a mixed powder containing 1,000 ppm or less in total of elements other than Al, O, F, H, C, and S by mixing at least one type of transition alumina powder selected from the group consisting of gibbsite, boehmite, and γ-alumina and an $AlF_3$ powder so that the content of $AlF_3$ is 0.25 percent by mass or more; and a step (b) of obtaining a plate-like α-alumina powder by performing a heat treatment at 750° C. to 1,650° C. on the mixed powder which is placed in a container closed with a lid provided thereon, the container being prepared in advance so that the mass of $AlF_3$ contained in the mixed powder divided by the volume of the container is $1 \times 10^{-4}$ g/cm$^3$ or more, which is sealed in the container, or which is confined in a container formed of a porous material. In addition, the total value of the elements according to the present invention is the total value obtained from the quantitative values of the elements each detected by an inductively coupled plasma (ICP) emission spectroscopy, a firing (high-frequency heating)-infrared absorption spectroscopy, an inert gas fusion-thermal conductivity method, an inert gas fusion-nondispersive infrared absorption spectroscopy, or a pyrohydrolysis-ion chromatography, each of which will be describe later.

According to the method for manufacturing a plate-like alumna powder of the present invention, a plate-like alumina powder which is an aggregate of plate-like α-alumina particles can be easily obtained at a high purity without using a HF solution which is not easily handled. In addition, according to the manufacturing method of the present invention, since a starting raw material can be obtained by simply mixing a transition alumina powder and an $AlF_3$ powder, even when the amount to be processed by one treatment is increased, the quality of a plate-like alumina powder to be obtained is not adversely influenced. For the mixing of a transition, alumina powder and an $AlF_3$ powder, for example, a wet mixing method or a dry mixing method is preferably used. As the wet mixing method, for example, a pot mill, a rotary and revolutionary mixer, or a trommel may be used. In the case of the wet mixing, although a solvent is required to be dried, as this drying method, any method selected from air drying, inert gas-atmosphere drying, and vacuum drying may be used. On the other hand, as the dry mixing method, for example, a stirring mixer using at least one stirring blade, a rocking mixer, or a rotary and revolutionary mixer may be used. In addition, the form of an $AlF_3$ powder is not particularly limited as long as being uniformly mixed with a transition alumina powder, and for example, any one of fine particles, flakes, and fibers may be used. In addition, when $AlF_3$ films or bulky $AlF_3$ blocks are prepared and added to a transition alumina powder, although a reaction similar to that described above can be performed, it is not preferable since a plate-like alumina powder to be obtained becomes heterogeneous. The reaction mechanism of this manufacturing method in which plate-like α-alumina particles are obtained from the above transition alumina powder has not been understood yet, it may be supposed that the reaction between the transition alumina powder and $AlF_3$ is at least partially responsible for the mechanism. In addition, in order to promote the formation of a plate shape and an α-alumina crystal, a heat treatment must be performed while a gas component is confined to a certain extent by providing the lid on the container, sealing the mixed powder therein, or using the porous container, and hence, it may also be supposed that the gas component contributes to the reaction. Accordingly, it may also be supposed that steam generated from moisture in the atmosphere, moisture contained in the transition alumina powder, or the like contributes to the reaction. From the points described above, as the heat treatment atmosphere, an air atmosphere or an inert gas atmosphere is preferable, and an air atmosphere is particularly preferable.

In the method for manufacturing a plate-like alumina powder according to the present invention, through intensive research carried out on the factor which contributes to the plate shape formation, the mass percentage of $AlF_3$ in the mixed powder and the value of the $AlF_3$ mass/the container volume were found as the factors. Although the reason for this has not been understood yet, it is supposed that the factors described above function to maintain the concentration of a gas component generated by the reaction in the presence of $AlF_3$ at a constant value.

The plate-like alumina according to the present invention is plate-like alumina formed by the manufacturing method described above. The plate-like alumina as described above can be used as a raw material when oriented alumina is formed. For example, by a TGG (Templated Grain Growth) method, oriented alumina can be formed. In the TGG method, a small amount of plate-like alumina particles is used as template particles (seed crystal), a large amount of fine alumina particles is used as matrix particles, and those two types of particles are mixed together and fired to obtain highly oriented alumina. The average particle diameter of the above fine alumina particles is smaller than the average particle diameter of the plate-like alumina particles (the average value of the major axis lengths of the particle plate surfaces). Since a small amount of the template particles is oriented in molding, and a large amount of the matrix particles is continuously incorporated between the template particles in firing, a sintered body in which all the particles are oriented can be obtained.

DETAILED DESCRIPTION OF THE INVENTION

Figure 1A:
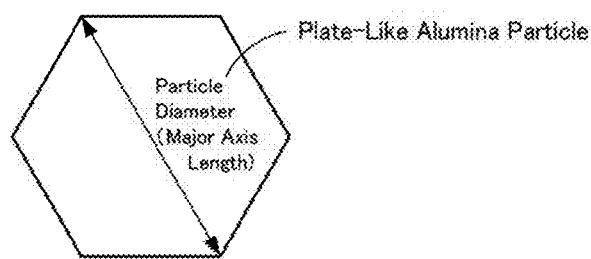
FIGS. 1A and 1B are schematic views of plate-like α-alumina particles, (a) is a plan view, and (b) is a front view.

A method for manufacturing a plate-like alumina powder according to the present invention comprises a step (a) of obtaining a mixed powder containing 1,000 ppm or less in total of elements other than Al, O, F, H, C, and S by mixing at least one type of transition alumina powder selected from the group consisting of gibbsite, boehmite, and γ-alumina and an $AlF_3$ powder so that the content of $AlF_3$ is 0.25 percent by mass or more; and a step (b) of obtaining a plate-like α-alumina powder by performing a heat treatment at 750° C. to 1,650° C. on the mixed powder which is placed in a container closed with a lid provided thereon, the container being prepared in advance so that the mass of $AlF_3$ contained in the mixed powder divided by the volume of the container is $1\times10^{-4}$ g/cm$^3$ or more, which is sealed in the container, or which is confined in a container formed of a porous material.

Since in the step (a), as the alumina powder, at least one type of transition alumina powder is selected from the group consisting of gibbsite, boehmite, and γ-alumina is used, plate-like α-alumina particles are obtained after the heat treatment of the step (b). When bayerite is used instead of those materials mentioned above, granular alumina particles or δ-alumina may be mixed in some cases after the beat treatment of the step (b).

In the step (a), as starting raw materials, a high-purity transition alumina powder and a high-purity $AlF_3$ powder are preferably used. The reason for this is that by the use of the materials described above, a high-purity plate-like alumina powder can be obtained after the heat treatment of the step (b). The total mass ratio of the elements (impurity elements) other than Al, O, F, H, C, and S contained in the mixed powder of the step (a) is preferably decreased as much as possible, and the total mass ratio is preferably 1,000 ppm or less, more preferably 100 ppm or less, and further preferably 10 ppm or less.

Since being evaporated, for example, at a temperature (such as 1,750° C. to 1,950° C.) at which an oriented alumina sintered body is fired, F, H, and S do not remain in the sintered body as the impurity elements. Hence, even if those elements are contained in the plate-like alumina powder used as a raw material, any problems may not occur. In addition, since the amount of the elements mentioned above can be reduced by an annealing treatment which will be described later, even if those elements are contained in the mixed powder, any problems may not occur.

The content of $AlF_3$ contained in the mixed powder in the step (a) is preferably set to 0.25 percent by mass or more. The reason for this is that when the content is less than 0.25 percent by mass, the alumina particles obtained after the heat treatment of the step (b) are formed so as not to have a plate shape. In addition, in this specification, whether the plate shape is formed or not is judged in such a way that when the aspect ratio of the alumina particles obtained after the heat treatment of the step (b) is 3 or more, the plate shape is formed, and when, the aspect ratio is less than 3, the plate shape is not formed. In this case, the aspect ratio is the average particle diameter/the average thickness, the average particle diameter is the average value of the major axis lengths of the particle plate surfaces, and the average thickness is the average value of the minor axis lengths (thicknesses) of the particles. The upper limit of the content of $AlF_3$ is not particularly limited, and even when no transition alumina is contained, that is, even when the content of $AlF_3$ is 100 percent by mass, the plate-like alumina can be obtained by an annealing treatment. However, when a large amount of $AlF_3$ remains, demerits, such as corrosion of a machine promoted due to a high F concentration and a large consumption of expensive $AlF_3$, may arise. When the rate of $AlF_3$ in the mixed powder is controlled, the particle diameter, the particle thickness, and the aggregation amount of the plate-like alumina to be obtained can be controlled. In order to increase the particle diameter, the rate of $AlF_3$ in the mixed powder is preferably increased. On the other hand, in order to increase the particle thickness and to decrease the aggregation amount, the rate of $AlF_3$ in the mixed powder is preferably decreased. In order to increase the particle diameter, the rate of $AlF_3$ in the mixed powder is preferably increased, and the rate is preferably 1.0 percent by mass or more and further preferably 4.0 percent, by mass or more. However, even if the rate of $AlF_3$ in the mixed powder is increased to 4.0 percent by mass or more, the effect of increasing the particle diameter may be degraded in some cases. In order to increase the particle thickness and to decrease the aggregation amount, the rate of $AlF_3$ in the mixed powder is preferably decreased, and the rate of $AlF_3$ is preferably 4.0 percent by mass or less and further preferably 2.7 percent by mass or less. However, in order to maintain the aspect ratio of the plate-like alumina at 3 or more, the rate of $AlF_3$ is must be set to 0.25 percent by mass or more as described above. As a range in which a large particle diameter and a high aspect ratio are both satisfied, and the aggregation amount is decreased, the rate of $AlF_3$ in the mixed powder is preferably in a range or 1.0 to 4.0 percent by mass and further preferably in a range of 1.5 to 3.0 percent by mass.

In the step (a), as the seed crystal, α-alumina particles are preferably added into the mixed powder. The reason for this is that by the above addition, at the initial stage of the heat treatment of the step (b), a crystal formation of the alumina particles is likely to proceed since the α-alumina particles function as nuclei. The thickness of the plate-like alumina particles tends to be determined depending on the particle diameter of the α-alumina particles. For example, the average particle diameter D50 of the α-alumina particles may be set to 0.1 to 16 µm. In addition, as the average particle diameter of the α-alumina particles is decreased, the aspect ratio of the plate-like alumina particles tends to increase. Hence, in order to synthesize a raw material having a high aspect ratio, the average particle diameter of the α-alumina particles is preferably 0.5 µm or less and more preferably approximately 0.1 µm. In addition, when the addition amount of the seed crystal is increased, the particle diameter of the plate-like alumina particles tends to decrease. In order to obtain plate-like alumina having a larger particle diameter, the addition amount of the α-alumina particles to be externally added to the total mass of the transition alumina and $AlF_3$ is preferably decreased, and the addition amount is preferably 4.2 percent by mass or less and further preferably 1.5 percent by mass or less. In order to obtain plate-like alumina having a uniform particle diameter, the addition amount of the α-alumina particles is preferably increased, and the addition amount is preferably 0.01 percent by mass or more and further preferably 0.1 percent by mass or more. As a range in which a large particle diameter and a uniform particle diameter are both satisfied, the addition amount of the α-alumina particles is preferably in a range of 0.01 to 4.2 percent by mass and further preferably in a range of 0.1 to 1.5 percent by mass. In addition, as the addition amount of the seed crystal is increased, the particle diameter of the plate-like alumina particles tends to decrease. Hence, in order to decrease the particle diameter of the plate-like alumina particles, the addition amount of the α-alumina particles is preferably increased, and the addition amount is preferably 1 percent by mass or more and preferably 3 percent by mass or more. Since the aspect ratio of the obtained plate-like alumina particles is decreased when the addition amount of the α-alumina particles is increased, in order to increase the aspect ratio of the plate-like alumina particles, the addition amount of the α-alumina particles is preferably set to 30 percent by mass or less.

In addition, as the seed crystals, plate-like alumina particles may also be used. By the use of α-alumina having a plate shape in advance as the seed crystal, the plate surface particle diameter (major axis length) of the plate-like alumina particles after synthesis is increased, and the aspect ratio can be increased. Although the plate surface particle diameter and the thickness of the plate-like alumina particles to be added are not particularly limited, in order to obtain plate-like alumina particles having a high aspect ratio, a powder having a high aspect ratio is preferably used as the seed crystal to be added. In addition, in order to obtain high-purity plate-like alumina particles, the plate-like alumina par tides to be added as the seed crystal preferably contain a small amount of impurities. In view of this point, the plate-like alumina particles formed by the method of the present invention is preferably added as the seed crystal.

In the step (b), the heat treatment is performed while the mixed powder is placed in the container closed with the lid provided thereon, is sealed in the container, or is confined in the container formed of a porous material. In any cases described above, after the heat treatment, plate-like α-alumina particles are obtained. Although the container preferably has a high sealing property so as to confine a gas component therein, when a completely sealed container is used, for example, a metal container is used, and sealing thereof must be performed by welding or the like. In addition, by a gas generated in the heat treatment, since the pressure inside the container is increased, the pressure resistance must be increased. Hence, in view of the workability and the manufacturing cost, instead of using a completely sealed container, a method for providing a lid for the container (for example, providing a lid thereon) or a method using a container formed of a porous material is preferable, and a method for providing a lid is particularly preferable.

In the step (b), as the container, a container in which the $AlF_3$ mass/container volume by $1\times10^{-4}$ g/cm$^3$ or more is used. The reason for this is that when the $AlF_3$ mass/container volume is less than $1\times10^{-4}$ g/cm$^3$, even if the heat treatment is performed, α-alumina cannot be obtained. A large $AlF_3$ mass/container volume is preferable since the particle shape, the aspect ratio, and the like of the plate-like α-alumina powder become uniform. Although the upper limit of the $AlF_3$ mass/container volume is not particularly limited, when the $AlF_3$ mass/container volume is excessively large, the amount of a gas component containing F is increased, corrosion of a machine may be promoted in some cases, and in view of a machine life, the $AlF_3$ mass/container volume is preferably small, such as preferably $2\times10^{-1}$ g/cm$^3$ or less and more preferably $2\times10^{-2}$ g/cm$^3$ or less.

It is not preferable that in the container used in the step (b), a component which evaporates at a heat treatment temperature or which reacts with an alumina component is contained. In addition, it is also not preferable that in a material forming the container, a component which is sublimated after reaction with an F component (such as $AlF_3$ gas) or an element forming a fluoride which has a low boiling point is contained. Hence, in a material forming the container, the total of elements other than Al, O, Mg, Ca, Sr, N, and Re (Re: rare earth element) is preferably 1 percent by mass or less. The reason for this is that since impurities derived from the container are not likely to be mixed in the plate-like alumina powder obtained after the heat treatment, a high-purity product can be obtained. In order to further increase the purity, the total of the elements described above is preferably 0.5 percent by mass or less and more preferably 0.1 percent by mass or less. Even if Mg, Ca, Sr, and Re each react with an F component to form a fluoride, the boiling point thereof is high, and the sublimation is not likely to occur. However, since Mg, Ca, Sr, and Re each may react with an alumina component in some cases, the container and the raw material powder must be handled not to be brought into contact with each other in such a way that the mixed powder is placed on a setter formed of alumina. Hence, as a material of the container as described above, $Al_2O_3$ having a purity of 99 percent by mass or more is preferably, and $Al_2O_3$ having a purity of 99.5 percent by mass or more is more preferable.

In the step (b), the heat treatment is performed at 750° C. to 1,650° C. When the heat treatment temperature is less than 750° C., it is not preferable since γ-alumina may remain in some cases after the heat treatment. When the heat treatment temperature is more than 1,650° C., it is also not preferable since the aspect ratio of an obtained powder is less than 3. The heat treatment temperature is preferably 850° C. to 1,350° C., further preferably 850° C. to 1,200° C., and most preferably 80° C. to 1,100° C.

In the step (b), after the heat treatment is performed, a disintegration treatment may be performed on the plate-like alumina. By this treatment, bulky aggregated plate-bike α-alumina particles can be disintegrated. Accordingly, as a raw material forming oriented alumina, plate-like alumina powder having an appropriate shape can be provided. The disintegration method is not particularly limited, and for example, there may be used a ball mill, a bead mill, a vibration mill, a jet mill, a hammer mill, a pin mill, a pulverizer, a millstone type grinder, a wet-type pulverizing apparatus, and other airflow-type, and mechanical-type pulverizers.

The method for manufacturing a plate-like alumina powder of the present indention may further include a step (c) of performing an annealing treatment, on the plate-like alumina powder obtained in the step (b) in an air atmosphere, an inert atmosphere, or a vacuum atmosphere at a temperature of 500° C. to 1,350° C. In this case, the "vacuum" represents a pressure lower than the atmospheric pressure. By the annealing treatment as described above, the concentration of impurity elements, in particular, such as F, remaining in the plate-like alumina powder obtained in the step (b) can be further decreased or can be decreased to zero. When the temperature of the annealing treatment is less than 500° C., it is not preferable since the F concentration of the plate-like alumina particles is not substantially changed before and after the annealing treatment. When the temperature of the annealing treatment is more than 1,350° C., it is not preferable since the aspect ratio is excessively decreased due to fusion of peripheries of the plate-like alumina particles and/or sintering therebetween. In order to effectively decrease the concentration of F and also to maintain the shape of the plate-like alumina particles, the temperature of the annealing treatment is preferably 700° C. to 1,250° C., more preferably 800° C. to 1,200° C., and further preferably 900° C. to 1,200° C. In addition, a container to be used in the annealing is preferably formed of a material similar to that of the container used for forming the plate-like alumina particles, and a lid is preferably not provided so that the impurity elements such as F are likely to evaporate. In particular, in order to reduce the amount of the impurity elements, $Al_2O_3$ having a purity of 99 percent by mass or more is preferable, and $Al_2O_3$ having a purity of 99.5 percent by mass or more is more preferable.

After the annealing treatment of the step (c) is performed, a disintegration treatment may be performed on the plate-like alumina. By this treatment, bulky aggregated plate-like α-alumina particles can be disintegrated. Accordingly, as a raw material forming oriented alumina, a plate-like alumina powder having an appropriate shape can be provided. The disintegration method is not particularly limited, and for example, there may be used a method in which disintegration is performed by pushing bulky α-alumina to a mesh or a screen having an opening diameter of 10 to 100 µm, a ball mill, a bead mill, a vibration mill, a jet mill, a hammer mill, a pin mill, a pulverizer, a millstone type grinder, a wet-type pulverizing apparatus, and other airflow-type and mechanical-type pulverizers.

The plate-like alumina powder of the present invention is a plate-like alumina powder formed by the method for manufacturing a plate-like alumina powder described above, and in plate-like α-alumina particles forming the above plate-like alumina powder, a crystal plane orthogonal to the c-axis grows to form a plate shape, the average particle diameter D50 is 0.3 to 50 µm, and the aspect ratio represented by the plate surface particle diameter/thickness is 3 to 500. The plate-like alumina powder as described above is suitable to form an oriented alumina sintered body and is preferably processed, for example, by tape molding, extrusion molding, or casting molding without any obstructions. In addition, in the plate-like alumina powder of the present invention, the mass ratio of each element other than Al, O, H, F, C, and S is preferably 10 ppm or less.

EXAMPLES

Figure 1B:
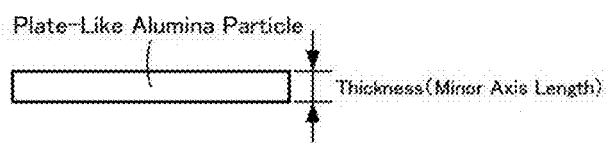

1. Evaluation Method of Alumina Powder (1) Particle Diameter, Thickness, and Aspect Ratio The average particle diameter, the average thickness, and the aspect ratio of particles contained in a plate-like alumina powder obtained in each experimental example of the following 2. were determined by observing arbitrary 100 particles in the plate-like alumina powder by a scanning electron microscope (SEM), The average particle diameter is the average value of the major axis lengths of the particle plate surfaces, the average thickness is the average value of the minor axis lengths (thicknesses) of the particles, and the aspect ratio is obtained, from the average particle diameter/average thickness by calculation. Schematic views of plate-like α-alumina particles are shown in FIGS. 1A and 1B. FIG. 1A is a plan view, and FIG. 1B is a front view. The plate-like α-alumina particles each have an approximately hexagonal shape when viewed in plan, the particle diameter thereof is as shown in FIG. 1A, and the thickness is as shown in FIG. 1B.

(2) Purity

Among elements contained in the plate-like alumina powder obtained in each experimental example, quantitative analysis of F was performed by a pyrohydrolysis-ion chromatography; that of C and S was performed by a firing (high-frequency heating)-infrared absorption spectroscopy; that of N was performed by an inert gas fusion-thermal conductivity method; and that of H was performed by an inert gas fusion-nondispersive infrared absorption spectroscopy. The quantitative analysis of other elements (such as Si, Fe, Ti, Na, Ca, Mg, K, P, V, Cr, Mn, Co, Mn, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu) was performed by an ICP emission spectroscopy.

In particular, the quantitative analysis of the elements contained in the plate-like alumina powder obtained in each experimental example was performed by the following method.

C, S: Analysis was performed by a firing (high-frequency heating)-infrared absorption spectroscopy using a carbon/sulfur analysis apparatus (CS844 manufactured by LECO).

N: Analysis was performed by an inert gas fusion-thermal conductivity method using an oxygen/nitrogen analysis apparatus (EMGA-650W manufactured by Horiba, Ltd.).

H: Analysis was performed by an inert gas fusion-nondispersive infrared absorption spectroscopy using a hydrogen analysis apparatus (EMGA-921 manufactured by Horiba, Ltd.).

F: Analysis was performed by a pyrohydrolysis-ion chromatography. The plate-like alumina powder was heated by a thermal hydrolysis method in accordance with JISR1675, and analysis was performed using an ion chromatography (IC-2000 manufactured by Thermo Fisher Scientific K.K.).

Impurity elements other than those mentioned above (such as Si, Fe, Ti, Na, Ca, Mg, K, P, V, Cr, Mn, Co, Ni, Cu, Zn, Y, Sr, Pb, Bi, Li, Be, B, Cl, Sc, Ga, Ge, As, Se, Br, Rb, Sr, Nb, Ho, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu): The plate-like alumina powder was fused by a pressurized sulfuric acid decomposition method in accordance with JISR1649, and analysis was performed using an ICP emission spectroscopy analyzer (PS3520UV-DD manufactured by Hitachi High-Tech Science Corp.).

(3) Crystal Phase

The crystal phase of the plate-like alumna powder obtained by each experimental example was identified from an X-ray diffraction spectrum obtained by 2θ/θ measurement using an X-ray diffraction apparatus (D8 ADVANCE manufactured by BRUKER). In this analysis, the CuKα line was used, and measurement was perforated at a 2θ/θ of 20° to 70° under conditions in which the tube current was set to 40 mA and the tube voltage was set to 40 kV.

(4) Average Particle Diameter (D50) of Seed Crystal

The average particle diameter (D50) of the seed crystal was measured using a particle size distribution measurement apparatus (MT3300II manufactured by Nikkiso Co., Ltd.).

(5) Presence or Absence of Aggregation

The presence or absence of aggregation was determined by observing particles in the plate-like alumina powder using a SEM as was the above 1. (1). The aggregation represents the state in which plate-like particles are tightly adhered to each other while the plate shapes thereof are maintained and indicates the state in which the particles are physically and chemically bonded to each other. Necking is also regarded as one form of the aggregation.

2. Experimental Examples (1) Experimental Example 1

Figure 2:
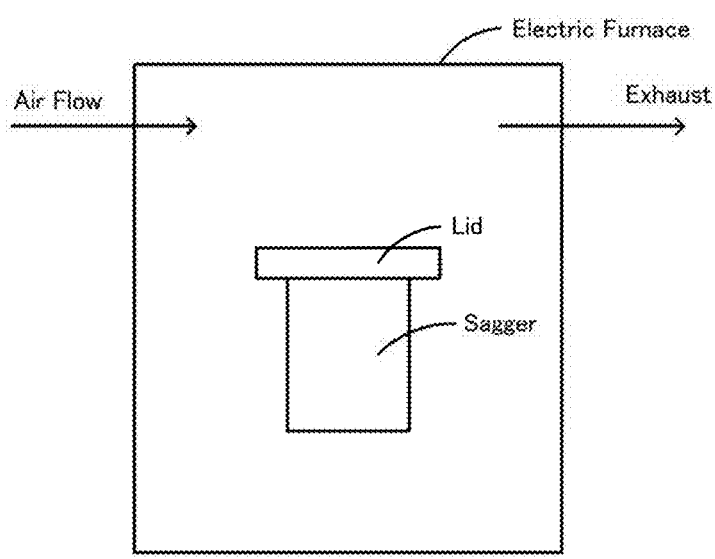
FIG. 2 is a schematic view of an experimental apparatus used in Experimental Example 1.

First, 96 parts by mass of a high-purity γ-alumina powder (TM-300D, manufactured by Taimei Chemical Co., Ltd.), 4 parts try mass of a high-purity $AlF_3$ powder (special reagent grade, manufactured by Kanto Chemical Co., Inc.), 0.17 parts by mass of a high purity α-alumina powder (TM-DAR, manufactured by Taimei Chemical Co., Ltd., D50=0.1 μm) as a seed crystal were mixed together with IPA (isopropyl alcohol) as a solvent for 5 hours using alumina balls having a diameter of 2 mm by a pot mill. The purities of the high-purity γ-alumina, the high-purity $AlF_3$, and the high-purity α-alumina powder, each of which was used as described above, were evaluated, and it was found that the mass ratio of each impurity element other than Al, O, F, H, C, and S was 10 ppm or less, and that the total of the impurity elements in the obtained mixed powder was 1,000 ppm or less. In a high-purity alumina-made sagger (volume: 750 $cm^3$) having a purity of 99.9 percent by mass, 300 g of the obtained mixed powder was received, and after a high-purity alumina-made lid having a purity of 99.9 percent by mass was placed on the sagger, a heat treatment was performed at 900° C. for 3 hours in an electric furnace in an air flow atmosphere, so that an alumina powder was obtained. The flow rate of air was set to 25,000 cc/min. In FIG. 2, a schematic view of an experimental apparatus used in this case is shown. The value ($AlF_3$ mass/container volume) obtained by dividing the $AlF_3$ mass by the volume (container volume) of the sagger was 0.016 $g/cm^3$.

Figure 3:
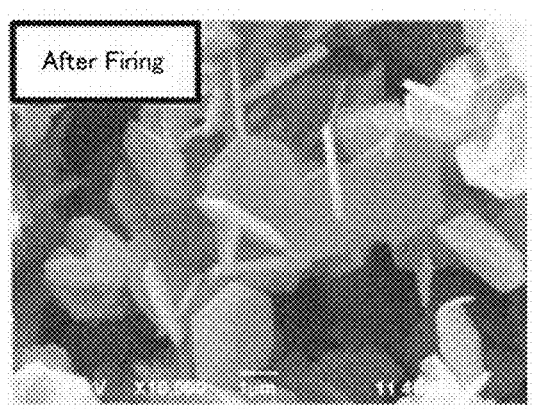
FIG. 3 is a SEM photo of the powder obtained in Experimental Example 1.

When the particles contained in the obtained powder were observed by a SEM, the particle diameter was 2.3 μm, the thickness was 0.2 μm, and the aspect ratio was 11.5. When the impurity elements other than Al, O, F, H, C, and S in this powder were evaluated, the mass ratio of each impurity element was 10 ppm or less, and the mass ratio of F was 14,500 ppm. In addition, the "ppm" represents the mass ratio. The crystal phase was α-alumina. In FIG. 3, a SEM photo of the powder obtained in Experimental Example 1 is shown.

The synthetic conditions and the characteristics of the synthesized powder of Experimental Example 1 are shown in Table 1. In addition, the synthetic conditions and the characteristics of the synthesized powders of Experimental Example 2 and Experimental Examples performed thereafter are also collectively shown in Table 1. In Table 1, the "impurity" represents elements other than Al, O, H, F, C, and S. The "F content" represents the mass ratio of F with respect to the total synthesized powder.

(2) Experimental Example 2

Except that the heat treatment temperature was set to 700° C., a powder was formed in a manner similar to that in Experimental Example 1. The crystal phase of the obtained powder included both γ-alumina and α-alumina.

(3) Experimental Example 3

Except that the heat treatment temperature was set to 750° C., a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having a small aspect ratio, and having a slightly large F content was obtained.

(4) Experimental Example 4

Except that the heat treatment temperature was set to 1,650° C., a powder was formed in a manner similar to that in Experimental Example 1. The obtained powder was a plate like alumina powder formed of plate-like α-alumina particles. In particular, compared to the powder of Experimental Example 1, a plate-like alumina powder containing approximately the same amount of impurities, having a small aspect ratio, and having a small F content was obtained.

(5) Experimental Example 5

Except that the heat treatment temperature was set to 1,700° C., a powder was formed in a manner similar to that in Experimental Example 1. Particles forming the obtained powder were α-alumina particles having an aspect ratio of only 2.5.

(6) Experimental Example 6

Except that a gibbsite powder (CL-303, manufactured by Sumitomo Chemical Co., Ltd.) was used instead of using a high-purity γ-alumina powder, a powder was formed in a manner similar to that in Experimental Example 1. The obtained powder was a plate-like alumina powder formed of plate-like α-alumina particles. In particular, compared to the powder of Experimental Example 1, a plate-like alumina powder having a large F content, having a slightly small aspect ratio, and containing a slightly large amount of impurities was obtained. In addition, the total of impurity elements in the mixed powder before the heat treatment was 1,000 ppm or less. In addition, in the obtained plate-like alumina powder, 120 ppm of Fe, 310 ppm of Na, and 40 ppm of Ga were contained, and the content of each impurity element other than those mentioned above was 10 ppm or less.

(7) Experimental Example 7

Except that a boehmite powder (VK-BG613, manufactured by Xuan Cheng Jing Rui New Material Co., Ltd.) was used instead of using a high-purity γ-alumina powder, a powder was formed in a manner similar to that in Experimental Example 1. The obtained powder was a plate-like alumina powder formed of plate-like α-alumina particles. In particular, compared to the powder of Experimental Example 1, a plate-like alumina powder having a slightly small aspect ratio, containing a slightly large amount of impurities, and having approximately the same F content, was obtained. In addition, the total of impurity elements in the mixed powder before the heat treatment was 1,000 ppm or less. In addition, in the obtained plate-like alumina powder, 60 ppm of Fe and 60 ppm of Si were contained, and the content of each impurity element other than those mentioned above was 10 ppm or less.

(8) Experimental Example 8

Except that the atmosphere in the heat treatment was changed from an air atmosphere to a nitrogen atmosphere, a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having approximately the same F content, and having a small aspect ratio was obtained.

(9) Experimental Example 9

Except that 99.8 parts by mass of a high-purity γ-alumina powder and 0.20 parts by mass of a high-purity $AlF_3$ powder were used, a mixed powder was formed in a manner similar to that in Experimental Example 1. In this case, the $AlF_3$ mass/container volume was 0.0008 $g/cm^3$. Particles forming the obtained powder were α-alumina particles in which although the F content was small, the aspect ratio was only 2.

(10) Experimental Example 10

Except that 99.75 parts by mass of a high-purity γ-alumina powder and 0.25 parts by mass of a high-purity $AlF_3$ powder were used, a powder was formed in a manner similar to that in Experimental Example 1. In this case, the $AlF_3$ mass/container volume was 0.001 $g/cm^3$. The obtained powder was a plate-like alumina powder formed of plate-like α-alumina particles. In particular, compared to the powder of Experimental Example 1, a plate-like alumina powder containing approximately the same amount of impurities, having a small aspect ratio, and having a small F content was obtained. In addition, the total of impurity elements in the mixed powder before the heat treatment was 1,000 ppm or less.

(11) Experimental Example 11

Except that 50 parts by mass of a high-purity γ-alumina powder and 50 parts by mass of a high-purity $AlF_3$ powder were used, a powder was formed in a manner similar to that in Experimental Example 1. In this case, the $AlF_3$ mass/container volume was 0.2 $g/cm^3$. The obtained powder was a plate-like alumina powder formed of plate-like α-alumina particles. In particular, compared to the powder of Experimental Example 1, a plate-like alumina powder having approximately the same aspect ratio, containing approximately the same amount of impurities, and having a large F content was obtained. In addition, the total of impurity elements in the mixed powder before the heat treatment was 1,000 ppm or less.

(12) Experimental Example 12

Except that no lid was used in the heat treatment, a powder was formed in a manner similar to that in Experimental Example 1. In the obtained powder, the crystal phase was γ-alumina as it was.

(13) Experimental Example 13

Except that the amount of the mixed powder was set to 1.5 g, a powder was formed in a manner similar to that in Experimental Example 1. In this case, the $AlF_3$ mass/container volume was 0.00008 $g/cm^3$. In the obtained powder, the crystal phase was γ-alumina as it was.

(14) Experimental Example 14

Except that the amount of the mixed powder was set to 1.9 g, a powder was formed in a manner similar to that in Experimental Example 1. In this case, the $AlF_3$ mass/container volume was 0.0001 $g/cm^3$. The obtained powder was a plate-like alumina powder formed of plate-like α-alumina particles. In particular, compared to the powder of Experimental Example 1, a plate-like alumina powder containing approximately the same amount of impurities, having a small aspect ratio, and having a small F content was obtained.

(15) Experimental Example 15

Except that a high-purity α-alumina powder was not used as the seed crystal, a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having approximately the same F content, and having a small aspect ratio was obtained. In addition, the total of impurity elements in the mixed powder before the heat treatment was 1,000 ppm or less.

(16) Experimental Example 16

Except that a high-purity α-alumina powder (AKP-20, manufactured by Sumitomo Chemical Co., Ltd., D50: 0.5 μm) was used as the seed crystal, a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having approximately the same F content, and having a slightly small aspect ratio was obtained. In addition, the total of impurity elements in the mixed powder before the heat treatment was 1,000 ppm or less.

(17) Experimental Example 17

Except that a high-purity α-alumina powder LS-210, manufactured by Nippon Light Metal Co., Ltd., D50: 3.6 μm) was used as the seed crystal, a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having approximately the same F content, and having a small aspect ratio was obtained. In addition, the total of impurity elements in the mixed powder before the heat treatment was 1,000 ppm or less. From the results of Experimental Examples 1, 16, and 17, it was found that as the particle diameter D50 of the seed crystal was increased, the thickness of the α-alumina particles tended to increase.

(18) Experimental Example 18

Except that the addition amount of the seed crystal was set to 0.67 parts by mass, a powder was formed in a manner similar to that in Experimental Example 1. The obtained powder was a plate-like alumina powder formed of plate-like α-alumina particles. In particular, compared to the powder of Experimental Example 1, a plate-like alumina powder containing approximately the same amount of impurities, having approximately the same F content, and having a small aspect ratio was obtained. In addition, the total of impurity elements in the mixed powder before the heat treatment was 1,000 ppm or less.

(19) Experimental Example 19

Except that the addition amount of the seed crystal was set to 0.04 parts by mass, a powder was formed in a manner similar to that in Experimental Example 1. The obtained powder was plate-like alumina powder formed of plate-like α-alumina particles. In particular, compared to the powder of Experimental Example 1, a plate-like alumina powder containing approximately the same amount of impurities, having approximately the same F content, and having a high aspect ratio was obtained. From the results of Experimental Examples 1, 18, and 19, it was found that as the addition amount of the seed crystal was increased, the particle diameter of the α-alumina particles tended to decrease. In addition, the total of impurity elements in the mixed powder before the heat treatment was 1,000 ppm or less.

(20) Experimental Example 20

Except that as the materials of the sagger and the lid, alumina having a purity of 99.5 percent by mass was used, a powder was formed in a manner similar to that in Experimental Example 1. The obtained powder was a plate-like alumina powder formed of plate-like α-alumina particles. In particular, compared to the powder of Experimental Example 1, a plate-like alumina powder having approximately the same aspect ratio, having approximately the same F content, and containing a slightly large amount of impurities was obtained. In addition, in the obtained plate-like alumina powder, 15 ppm of Zr was contained, and the contents of impurity elements other than that described above were each 10 ppm or less.

(21) Experimental Example 21

Except that the powder was placed in a sagger formed of alumina having a purity of 99.9 percent after the heat treatment and was then processed by an annealing treatment in the air at 450° C. for 40 hours, a powder was formed in a manner similar to that in Experimental Example 1, The obtained powder was a plate-like alumina powder similar to that of Experimental Example 1.

(22) Experimental Example 22

Except that the annealing was performed in the air under conditions in which the temperature and the time were set to 900° C. and 200 hours, respectively, a powder was formed in a manner similar to that in Experimental Example 21. The obtained powder was a plate-like alumina powder formed of plate-like α-alumina particles. In particular, compared to the powders of Experimental Examples 1 and 21, a plate-like alumina powder having approximately the same aspect ratio, containing approximately the same amount of impurities, and having a remarkably small F content was obtained.

(23) Experimental Example 23

Except that the annealing was performed in the air under conditions in which the temperature and the time were set to 1,200° C. and 43 hours, respectively, a powder was formed in a manner similar to that in Experimental Example 21. The obtained powder was a plate-like alumina powder formed of plate-like α-alumina particles. In particular, compared to the powders of Experimental Examples 1 and 21, a plate-like alumina powder having a slightly small aspect ratio, containing approximately the same amount of impurities, and having a remarkably small F content was obtained.

(24) Experimental Example 24

Except that the annealing was perforated in the air under conditions in which the temperature and the time were set to 1,350° C. and 43 hours, respectively, a powder was formed in a manner similar to that in Experimental Example 21. The obtained powder was a plate-like alumina powder formed of plate-like α-alumina particles. In particular, compared to the powders of Experimental Examples 1 and 21, a plate-like alumina powder containing approximately the same amount of impurities, having a small aspect ratio, and having an F content equal to or less than the detection limit was obtained.

(25) Experimental Example 25

Except that the annealing was performed in the air under conditions in which the temperature and the time were set to 1,400° C. and 43 hours, respectively, a powder was formed in a manner similar to that in Experimental Example 21. The obtained powder was a plate-like α-alumina powder in which compared to the powders. In Experimental Examples 1 and 21, although the amount of impurities was approximately the same, and the F content was equal to or less than the detection limit, the aspect ratio was only 2.8.

(26) Experimental Example 26

Except that after the annealing treatment was performed, disintegration was performed using a pot mill, a powder was formed in a manner similar to that in Experimental Example 23. Although the obtained powder had a small aspect ratio as compared to that of Experimental Example 23, the aggregation was resolved.

(27) Experimental Example 27

Except that before the annealing treatment was performed, disintegration was performed using a pot mill, a powder was formed in a manner similar to that in Experimental Example 23. Compared to the powder of Experimental Example 23, the aspect ratio was only decreased, and the obtained powder was aggregated. From the results of Experimental Examples 26 and 27, it was found that when the annealing treatment was performed, in order to resolve the aggregation, disintegration had to be performed after the annealing treatment.

(28) Experimental Example 28

Except that after the plate-like alumina powder was synthesized, disintegration was performed using a pot mill, a powder was formed in a manner similar to that in Experimental Example 1. Although the obtained powder had a slightly small aspect ratio as compared to that of Experimental Example 1, the aggregation was resolved. From the result described above, it was found that when the annealing treatment was not performed, in order to resolve the aggregation, disintegration might be performed after the heat treatment.

(29) Experimental Example 29

Except that the amount of the mixed powder was set to 18.8 g, a powder was formed in a manner similar to that in Experimental Example 1. In this case, the $AlF_3$ mass/container volume was 0.001 g/cm$^3$. The obtained powder was a plate-like alumina powder formed of plate-like α-alumina particles. In particular, compared to the powder of Experimental Example 1, a plate-like alumina powder containing approximately same amount of impurities, having approximately the same F content, and having a small aspect ratio was obtained.

(30) Experimental Example 30

Except that 99.8 parts by mass of a high-purity γ-alumina and 0.20 parts by mass of a high-purity $AlF_3$ were used, and that the amount of the mixed powder was set to 375 g, a powder was formed in a manner similar to that in Experimental Example 1. In this case, the $AlF_3$ mass/container volume was 0.001 g/cm$^3$. Although the obtained powder contained approximately the same amount of impurities and had approximately the same F content as compared to the powder of Experimental Example 1, the aspect ratio was only 2.25, and the obtained powder was a powder formed of α-alumina particles having no plate shape. From the results of Experimental Examples 9, 10, 29, and 30, it was found that in order to synthesize a plate-like alumina powder, the $AlF_3$ mass/container volume, and the $AlF_3$ content, in the mixed powder were required to be 0.001 g/cm$^3$ or more and 0.25 percent by mass or more, respectively.

(31) Experimental Example 31

Except that the annealing was performed in the air under conditions in which the temperature and the time were set to 500° C. and 200 hours, respectively, a powder was formed in a manner similar to that in Experimental Example 21, The obtained powder was a plate-like alumina powder formed of plate-like α-alumina particles. In particular, compared to the powders of Experimental Examples 1 and 21, a plate-like alumina powder having approximately the same aspect ratio, containing approximately the same amount of impurities, and having a small F content was obtained. From the results of Experimental Examples 21 to 25 and 31, it was found that in order to decrease the F content to a certain extent or to zero while the plate shape of the α-alumina particles was maintained, the temperature in the annealing was preferably set to 500° C. to 1,350° C.

(32) Experimental Example 32

Except that 97.8 parts by mass of a high-purity γ-alumina and 2.2 parts by mass of a high-purity $AlF_3$ powder were used, a powder was formed in a manner similar to that in Experimental Example 1. In this case, the $AlF_3$ mass/container volume was 0.0088 g/cm$^3$. The obtained powder was a plate-like alumina powder formed of plate-like α-alumina particles.

(33) Experimental Example 33

Except that after the heat treatment was performed, the powder was placed in an alumina-made sagger having a purity of 99.5%, and the annealing treatment was performed in the air under conditions in which the temperature and the time were set to 1,150° C. and 43 hours, respectively, powder was formed in a manner similar to that in Experimental Example 1. The obtained powder was a plate-like alumina powder similar to that of Experimental Example 1. In particular, compared to the powder of Experimental Example 32, a plate-like alumina powder having a slightly small aspect ratio, containing approximately the same amount of impurities, and having a very small F content was obtained. Table 1

Synthetic Conditions

| Experimental Example | Transition Alumina | AlF$_3$ Content in Mixed Powder (mass %) | Mass of AlF$_3$ Contained in Mixed Powder Divided by Volume of Container (g/cm$^3$) | Seed Crystal D50 (μm) | Addition Amount of Seed Crystal (mass %) | Container | Lid | Heat Treatment Temperature (° C.) | Atmosphere | Annealing Temperature (° C.) | Disintegration Treatment |
|---|---|---|---|---|---|---|---|---|---|---|---|
| 1 | γ-Alumina |  | 0.016 | 0.1 | 0.17 | Alumina 99.9% | Presence | 900 | Air | — | — |
| 2 | γ-Alumina | 4 | 0.016 | 0.1 | 0.17 | Alumina 99.9% | Presence | 700 | Air | — | — |
| 3 | γ-Alumina | 4 | 0.016 | 0.1 | 0.17 | Alumina 99.9% | Presence | 750 | Air | — | — |
| 4 | γ-Alumina | 4 | 0.016 | 0.1 | 0.17 | Alumina 99.9% | Presence | 1650 | Air | — | — |
| 5 | γ-Alumina | 4 | 0.016 | 0.1 | 0.17 | Alumina 99.9% | Presence | 1700 | Air | — | — |
| 6 | Gibbsite | 4 | 0.016 | 0.1 | 0.17 | Alumina 99.9% | Presence | 900 | Air | — | — |
| 7 | Boehmite | 4 | 0.016 | 0.1 | 0.17 | Alumina 99.9% | Presence | 900 | Air | — | — |
| 8 | γ-Alumina | 4 | 0.016 | 0.1 | 0.17 | Alumina 99.9% | Presence | 900 | Nitrogen | — | — |
| 9 | γ-Alumina | 0.2 | 0.0008 | 0.1 | 0.17 | Alumina 99.9% | Presence | 900 | Air | — | — |
| 10 | γ-Alumina | 0.25 | 0.001 | 0.1 | 0.17 | Alumina 99.9% | Presence | 900 | Air | — | — |
| 11 | γ-Alumina | 50 | 0.2 | 0.1 | 0.17 | Alumina 99.9% | Presence | 900 | Air | — | — |
| 12 | γ-Alumina | 4 | 0.016 | 0.1 | 0.17 | Alumina 99.9% | Presence | 900 | Air | — | — |
| 13 | γ-Alumina | 4 | 0.00008 | 0.1 | 0.17 | Alumina 99.9% | Presence | 900 | Air | — | — |
| 14 | γ-Alumina | 4 | 0.0001 | 0.1 | 0.17 | Alumina 99.9% | Presence | 900 | Air | — | — |
| 15 | γ-Alumina | 4 | 0.016 | Absence | Absence | Alumina 99.9% | Presence | 900 | Air | — | — |
| 16 | γ-Alumina | 4 | 0.016 | 0.5 | 0.17 | Alumina 99.9% | Presence | 900 | Air | — | — |
| 17 | γ-Alumina | 4 | 0.016 | 3.6 | 0.17 | Alumina 99.9% | Presence | 900 | Air | — | — |
| 18 | γ-Alumina | 4 | 0.016 | 0.1 | 0.67 | Alumina 99.9% | Presence | 900 | Air | — | — |
| 19 | γ-Alumina | 4 | 0.016 | 0.1 | 0.04 | Alumina 99.9% | Presence | 900 | Air | — | — |
| 20 | γ-Alumina | 4 | 0.016 | 0.1 | 0.17 | Alumina 99.5% | Presence | 900 | Air | — | — |
| 21 | γ-Alumina | 4 | 0.016 | 0.1 | 0.17 | Alumina 99.9% | Presence | 900 | Air | 450 | — |
| 22 | γ-Alumina | 4 | 0.016 | 0.1 | 0.17 | Alumina 99.9% | Presence | 900 | Air | 900 | — |
| 23 | γ-Alumina | 4 | 0.016 | 0.1 | 0.17 | Alumina 99.9% | Presence | 900 | Air | 1200 | — |
| 24 | γ-Alumina | 4 | 0.016 | 0.1 | 0.17 | Alumina 99.9% | Presence | 900 | Air | 1350 | — |
| 25 | γ-Alumina | 4 | 0.016 | 0.1 | 0.17 | Alumina 99.9% | Presence | 900 | Air | 1400 | — |
| 26 |  |  |  | The Same as Experimental Example 23 |  |  |  |  |  |  | Performing (After Annealing) |
| 27 |  |  |  | The Same as Experimental Example 23 |  |  |  |  |  |  | Performing (Before Annealing) |
| 28 |  |  |  | The Same as Experimental Example 1 |  |  |  |  |  |  | Performing |
| 29 | γ-Alumina | 4 | 0.001 | 0.1 | 0.17 | Alumina 99.9% | Absence | 900 | Air | — | — |
| 30 | γ-Alumina | 0.2 | 0.001 | 0.1 | 0.17 | Alumina 99.9% | Absence | 900 | Air | — | — |
| 31 | γ-Alumina | 4 | 0.016 | 0.1 | 0.17 | Alumina 99.9% | Absence | 900 | Air | 500 | — |
| 32 | γ-Alumina | 2.2 | 0.0088 | 0.1 | 0.17 | Alumina 99.9% | Absence | 900 | Air | — | — |
| 33 | γ-Alumina | 2.2 | 0.0088 | 0.1 | 0.17 | Alumina 99.9% | Absence | 900 | Air | 1150 | — |

Characteristics of Synthesized Powders*[3]

| Experimental Example | Particle Diameter of Plate Surface (μm) | Average Thickness (μm) | Aspect Ratio | Crystal Phase | Impurity Greater Than 10 ppm*[1] | F Content (ppm*[2]) | Presence or Absence of Aggregation |
|---|---|---|---|---|---|---|---|
| 1 | 2.3 | 0.2 | 11.5 | α-Al$_2$O$_3$ | Absence | 14500 | Presence |
| 2 | — | — | — | α-Al$_2$O$_3$ and γ-Al$_2$O$_3$ | — | — | — |
| 3 | 0.9 | 0.2 | 4.5 | α-Al$_2$O$_3$ | Absence | 22000 | Presence |
| 4 | 1.6 | 0.5 | 3.2 | α-Al$_2$O$_3$ | Absence | 500 | Presence |
| 5 | 1.5 | 0.6 | 2.5 | α-Al$_2$O$_3$ | Absence | 470 | Presence |
| 6 | 2.1 | 0.2 | 10.5 | α-Al$_2$O$_3$ | Fe, Na, Ca | 22000 | Presence |
| 7 | 1.9 | 0.2 | 9.5 | α-Al$_2$O$_3$ | Fe, Si | 17000 | Presence |
| 8 | 1.3 | 0.4 | 3.3 | α-Al$_2$O$_3$ | Absence | 15000 | Presence |
| 9 | 0.8 | 0.4 | 2 | α-Al$_2$O$_3$ | Absence | 450 | Presence |
| 10 | 0.9 | 0.3 | 3 | α-Al$_2$O$_3$ | Absence | 600 | Presence |
| 11 | 2.3 | 0.2 | 11.5 | α-Al$_2$O$_3$ | Absence | 150000 | Presence |
| 12 | — | — | — | γ-Al$_2$O$_3$ | — | — | — |
| 13 | — | — | — | γ-Al$_2$O$_3$ | — | — | — |
| 14 | 0.8 | 0.25 | 3.2 | α-Al$_2$O$_3$ | Absence | 4000 | Presence |
| 15 | 1.5 | 0.4 | 3.8 | α-Al$_2$O$_3$ | Absence | 14500 | Presence |
| 16 | 7 | 0.7 | 10 | α-Al$_2$O$_3$ | Absence | 14500 | Presence |
| 17 | 35 | 4 | 8.8 | α-Al$_2$O$_3$ | Absence | 14500 | Presence |
| 18 | 1 | 0.2 | 5 | α-Al$_2$O$_3$ | Absence | 14500 | Presence |
| 19 | 4 | 0.2 | 20 | α-Al$_2$O$_3$ | Absence | 14500 | Presence |
| 20 | 2.3 | 0.2 | 11.5 | α-Al$_2$O$_3$ | Zr | 14500 | Presence |

| | | | | | | | |
|---|---|---|---|---|---|---|---|
| 21 | 2.3 | 0.2 | 11.5 | $\alpha$-$Al_2O_3$ | Absence | 14500 | Presence |
| 22 | 2.3 | 0.2 | 11.5 | $\alpha$-$Al_2O_3$ | Absence | 200 | Presence |
| 23 | 1.9 | 0.3 | 6.3 | $\alpha$-$Al_2O_3$ | Absence | 24 | Presence |
| 24 | 1.7 | 0.5 | 3.4 | $\alpha$-$Al_2O_3$ | Absence | <10 | Presence |
| 25 | 1.7 | 0.6 | 2.8 | $\alpha$-$Al_2O_3$ | Absence | <10 | Presence |
| 26 | 1.8 | 0.3 | 6.0 | $\alpha$-$Al_2O_3$ | Absence | 24 | Absence |
| 27 | 1.8 | 0.3 | 6.0 | $\alpha$-$Al_2O_3$ | Absence | 18 | Presence |
| 28 | 1.9 | 0.2 | 9.5 | $\alpha$-$Al_2O_3$ | Absence | 14500 | Absence |
| 29 | 1.5 | 0.2 | 7.5 | $\alpha$-$Al_2O_3$ | Absence | 10000 | Presence |
| 30 | 0.9 | 0.4 | 2.25 | $\alpha$-$Al_2O_3$ | Absence | 1400 | Presence |
| 31 | 2.3 | 0.2 | 11.5 | $\alpha$-$Al_2O_3$ | Absence | 10000 | Presence |
| 32 | 1.8 | 0.4 | 4.5 | $\alpha$-$Al_2O_3$ | Absence | 8000 | Presence |
| 33 | 1.6 | 0.5 | 3.2 | $\alpha$-$Al_2O_3$ | Absence | 60 | Presence |

*[1] Impurity represents elements other than Al, O, H, F, C, and S.
*[2] F content represents the mass ratio of F with respect to the total powder.
*[3] Because $\alpha$-$Al_2O_3$ was not synthesized in Experimental Examples 2, 12, and 13, evaluations were not performed.

In addition, among Experimental Examples 1 to 33, 26 experimental examples except for Experimental Examples 2, 5, 9, 12, 13, 25, and 30 correspond to the examples of the present invention. Experimental Example 25 is an example in which the annealing treatment is performed after the heat treatment, and before the annealing treatment is performed. Experimental Example 25 corresponds to the example of the present invention since the process is the same as that of Experimental Example 1; however, after the annealing treatment is performed, since the aspect ratio is less than 3, Experimental Example 25 is out of the examples of the present invention. The present invention is not limited at all to those examples and may be performed in various ways without departing from the technical scope of the present invention.

The present application claims priority from Japanese Patent Application No. 2014-241684 filed on Nov. 28, 2014, the entire contents of which are incorporated herein by reference.

What is claimed is:

1. A method for manufacturing a plate-like alumina powder comprising:

a step (a) of obtaining a mixed powder containing 1,000 ppm or less in total of elements other than Al, O, F, H, C, and S by mixing at least one type of transition alumina powder selected from the group consisting of gibbsite, boehmite, and $\gamma$-alumina and an $AlF_3$ powder so that the content of $AlF_3$ is 0.25 percent by mass or more;

a step (b) of obtaining a plate-like $\alpha$-alumina powder by performing a heat treatment at 750° C. to 1,650° C. on the mixed powder which is placed in a container closed with a lid provided thereon, the container being prepared in advance so that the mass of $AlF_3$ contained in the mixed powder divided by the volume of the container is $1 \times 10^{-4}$ g/cm$^3$ or more, which is sealed in the container, or which is confined in a container formed of a porous material; and after the step (b), a step (c) of performing an annealing treatment on the plate-like alumina powder obtained in the step (b) in an atmosphere consisting of an air atmosphere, an inert atmosphere, or a vacuum atmosphere at a temperature of 500° C. to 1,350° C.

2. The method for manufacturing a plate-like alumina powder according to claim 1, wherein in the step (a), the mass ratio of each element other than Al, O, F, H, C, and S contained in the mixed powder is 10 ppm or less.

3. The method for manufacturing a plate-like alumina powder according to claim 1, wherein in the step (a), as a seed crystal, $\alpha$-alumina particles are added into the mixed powder.

4. The method for manufacturing a plate-like alumina powder according to claim 1, wherein in the step (b), the container is formed of 99.5 percent by mass or more of alumina.

5. The method for manufacturing a plate-like alumina powder according to claim 1, wherein in the step (b), after the heat treatment is performed, a disintegration treatment is performed on the plate-like alumina.

6. The method for manufacturing a plate-like alumina powder according to claim 1, wherein in the step (c), after the annealing treatment is performed, a disintegration treatment is performed on the plate-like alumina.

* * * * *